(12) United States Patent
Subramanian et al.

(10) Patent No.: US 12,203,742 B2
(45) Date of Patent: Jan. 21, 2025

(54) SYSTEM AND METHOD FOR DIGITAL-REPRESENTATION-BASED FLIGHT PATH PLANNING FOR OBJECT IMAGING

(71) Applicant: Photogauge, Inc., Belmont, CA (US)

(72) Inventors: Sankara J. Subramanian, Chennai (IN); Sameer Sharma, Chennai (IN); Azhar H. Khan, Alamo, CA (US)

(73) Assignee: Photogauge, Inc., Belmont, CA (US)

( * ) Notice: Subject to any disclaimer, the term of this patent is extended or adjusted under 35 U.S.C. 154(b) by 896 days.

(21) Appl. No.: 17/344,425

(22) Filed: Jun. 10, 2021

(65) Prior Publication Data

US 2021/0304395 A1 Sep. 30, 2021

Related U.S. Application Data

(63) Continuation-in-part of application No. 17/128,141, filed on Dec. 20, 2020, now Pat. No. 11,410,293, and
(Continued)

(51) Int. Cl.
*G06T 7/00* (2017.01)
*G01B 11/24* (2006.01)
(Continued)

(52) U.S. Cl.
CPC ............. *G01B 11/24* (2013.01); *G06F 30/17* (2020.01); *G06T 7/0004* (2013.01); *G06T 7/30* (2017.01);
(Continued)

(58) Field of Classification Search
CPC ....... G01B 11/24; G06F 30/17; G06T 7/0004; G06T 7/30; G06T 7/579; G06T 7/75;
(Continued)

(56) References Cited

U.S. PATENT DOCUMENTS 5,530,652 A 6/1996 Croyle
5,621,811 A 4/1997 Roder
(Continued)

FOREIGN PATENT DOCUMENTS

GB 2406657 4/2005
WO WO2017/173417 A1 10/2017
WO WO-2021059438 A1 * 4/2021 ............ B25J 9/1697

OTHER PUBLICATIONS

PCT International Preliminary Report on Patentability, International Application No. PCT/US2022/032558, International filing date, Jun. 7, 2022, Applicant, Photogauge, Inc., 5 pages.
(Continued)

*Primary Examiner* — Carol Wang
(74) *Attorney, Agent, or Firm* — Inventive Law Inc.; Jim H. Salter

(57) ABSTRACT

A system and method for digital-representation-based flight path planning for object imaging is disclosed. An example embodiment is configured to: obtain a digital representation of an object; retrieve a dataset of image acquisition configuration parameters; extract a surface contour of the object from the digital representation of the object; generate a bounding polygon adjacent to the surface contour of the object, the bounding polygon being set-off from the surface contour of the object based on a configuration defined in the image acquisition configuration parameters; generate a configurable quantity of waypoints at configurable intervals along the bounding polygon; and generate an Image Acquisition Plan (IAP) from the waypoints, the IAP including, for each waypoint, a waypoint position, control instructions, and imaging instructions.

20 Claims, 11 Drawing Sheets

Related U.S. Application Data a continuation-in-part of application No. 16/131,456, filed on Sep. 14, 2018, now abandoned, said application No. 17/128,141 is a continuation of application No. 16/023,449, filed on Jun. 29, 2018, now Pat. No. 10,885,622, said application No. 16/131,456 is a continuation-in-part of application No. 16/023,449, filed on Jun. 29, 2018, now Pat. No. 10,885,622.

(51) Int. Cl.
| | |
|---|---|
| *G06F 30/17* | (2020.01) |
| *G06T 7/30* | (2017.01) |
| *G06V 10/44* | (2022.01) |
| *G06V 20/10* | (2022.01) |
| *G06V 20/13* | (2022.01) |
| *G06V 20/17* | (2022.01) |
| *G06V 20/20* | (2022.01) |
| *G06V 10/24* | (2022.01) |

(52) U.S. Cl.
CPC .............. *G06V 10/44* (2022.01); *G06V 20/10* (2022.01); *G06V 20/13* (2022.01); *G06V 20/17* (2022.01); *G06V 20/20* (2022.01); *G06V 10/245* (2022.01)

(58) Field of Classification Search
CPC . G06T 2207/10032; G06T 2207/30108; G06T 2207/30241; G06T 2207/30244; G06T 2207/30252; G06V 10/44; G06V 10/245; G06V 20/10; G06V 20/17; G06V 20/20; G06V 20/13; G06V 2201/12
See application file for complete search history.

(56) References Cited

U.S. PATENT DOCUMENTS

| | | | |
|---|---|---|---|
| 6,259,815 B1 | 7/2001 | Anderson | |
| 6,795,194 B2 | 9/2004 | Pallingen | |
| 8,233,665 B2 | 7/2012 | Nakatsukasa | |
| 8,923,555 B2 | 12/2014 | Inomata | |
| 9,221,481 B2 | 12/2015 | Desbordes | |
| 9,430,850 B1 | 8/2016 | Domanski | |
| 9,454,692 B2 | 9/2016 | Zhang et al. | |
| 9,778,023 B2 | 10/2017 | Osaki | |
| 10,060,857 B1 | 8/2018 | Bouchard | |
| 10,347,139 B2 | 7/2019 | Kohn-Rich | |
| 10,885,622 B2 | 1/2021 | Subramanian | |
| 2002/0031223 A1 | 3/2002 | Knighton | |
| 2002/0033955 A1 | 3/2002 | Knighton | |
| 2002/0050988 A1 | 5/2002 | Petrov | |
| 2002/0118874 A1 | 8/2002 | Chung | |
| 2003/0218607 A1 | 11/2003 | Baumberg | |
| 2004/0017883 A1 | 1/2004 | Takagi | |
| 2004/0126002 A1 | 7/2004 | Chang | |
| 2005/0128551 A1 | 6/2005 | Yang | |
| 2006/0210076 A1 | 9/2006 | Knighton | |
| 2006/0221351 A1 | 10/2006 | Yu | |
| 2007/0285537 A1 | 12/2007 | Dwinell | |
| 2008/0212840 A1 | 9/2008 | Shalom | |
| 2010/0118027 A1 | 5/2010 | Weiss | |
| 2011/0096896 A1 | 4/2011 | Kunzmann | |
| 2012/0105867 A1 | 5/2012 | Komatsu | |
| 2012/0314040 A1 | 12/2012 | Kopf | |
| 2013/0155187 A1 | 6/2013 | Skyberg | |
| 2013/0258045 A1 | 10/2013 | Wojciech | |
| 2014/0363048 A1 | 12/2014 | Vrcelj | |
| 2016/0073095 A1 | 3/2016 | Ogura | |
| 2016/0123893 A1 | 5/2016 | Klaas | |
| 2016/0124435 A1 | 5/2016 | Thompson | |
| 2016/0156829 A1 | 6/2016 | Takamori | |
| 2016/0327383 A1 | 11/2016 | Becker | |
| 2016/0371542 A1 | 12/2016 | Sugita | |
| 2017/0109104 A1 | 4/2017 | Dahlberg | |
| 2017/0176226 A1 | 6/2017 | Dockrey | |
| 2017/0185226 A1 | 6/2017 | Matsumura | |
| 2018/0211373 A1 | 7/2018 | Stoppa | |
| 2018/0309976 A1 | 10/2018 | Mun | |
| 2018/0322623 A1 | 11/2018 | Memo | |
| 2018/0350148 A1 | 12/2018 | George | |
| 2019/0128670 A1 | 5/2019 | Chen | |
| 2019/0143523 A1 | 5/2019 | Harel | |
| 2019/0392643 A1* | 12/2019 | Busto | G06F 3/016 |
| 2020/0005422 A1 | 1/2020 | Subramanian | |
| 2020/0005448 A1 | 1/2020 | Subramanian | |

OTHER PUBLICATIONS

PCT International Search Report and Written Opinion, International Application No. PCT/US2022/032558, International filing date, Jun. 7, 2022, Applicant, Photogauge, Inc., 7 pages.

Ahmadabadian, Ali Hosseininaveh, R. Yazdan, A. Karami, M. Moradi, and F. Ghorbani. "Clustering and selecting vantage images in a low-cost system for 3D reconstruction of texture-less objects." Measurement 99 (2017): 185-191. (Year: 2017).

Ishida, Kasei. "Investigating the accuracy of 3D models created using SfM." In ISARC. Proceedings of the International Symposium on Automation and Robotics in Construction, vol. 34. IAARC Publications, 2017. (Year: 2017).

Zhang, Cha, and Zhengyou Zhang. "Calibration between depth and color sensors for commodity depth cameras." Computer vision and machine learning with RGB-D sensors. Springer, Cham, 2014. 47-64. (Year: 2014).

* cited by examiner

Stage 1 – Object Contour Extraction

Stage 2 – Bounding Polygon Generation

Stage 2 – Bounding Polygon Generation

Stage 3 – Image Acquisition Plan (IAP) Generation

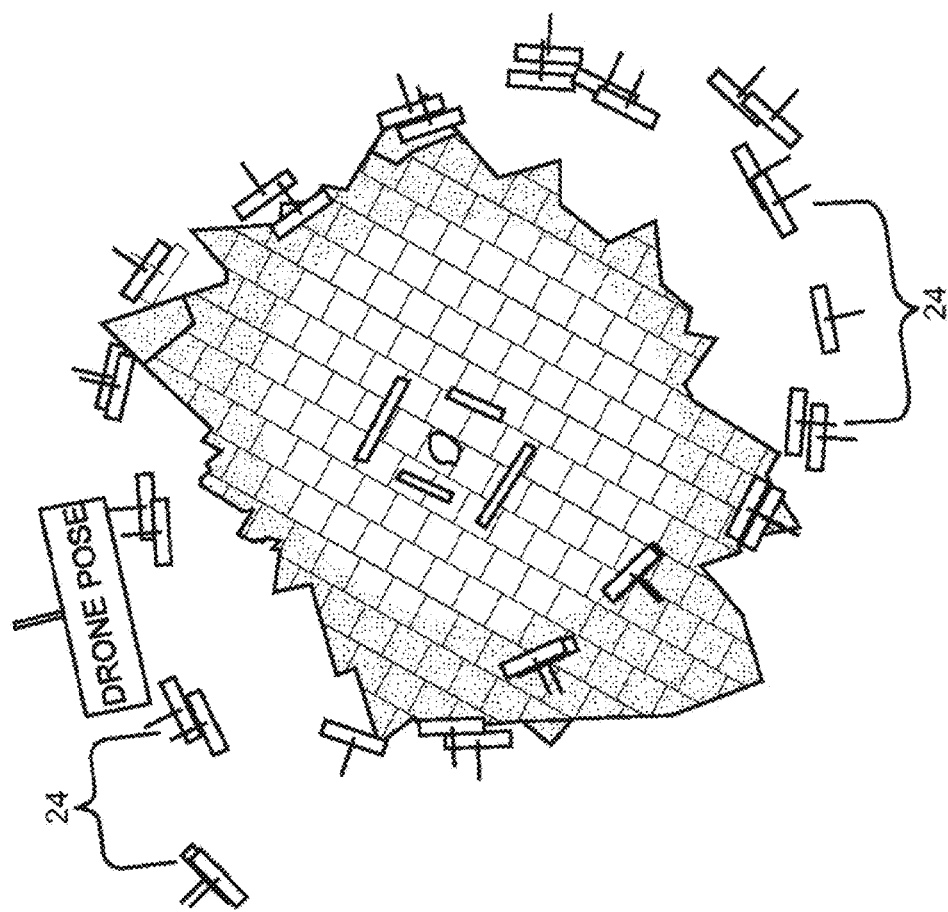
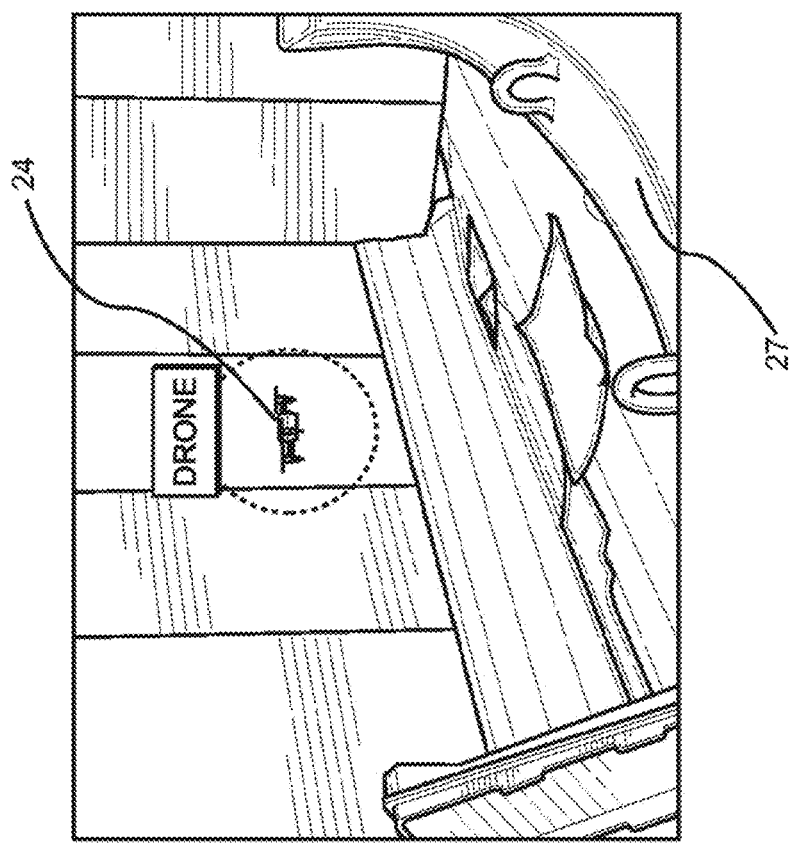
FIG. 7

```
┌─────────────────────────────────────────┐
│       System and Method for             │
│ Digital Representation-Based Flight Path Planning for Object Imaging │
│           Processing Logic              │
│              -2000-                     │
└─────────────────────────────────────────┘
                    │
                    ▼
┌─────────────────────────────────────────┐
│  Obtain a digital representation of an object. │
│              -2010-                     │
└─────────────────────────────────────────┘
                    │
                    ▼
┌─────────────────────────────────────────┐
│ Retrieve a dataset of image acquisition configuration parameters. │
│              -2020-                     │
└─────────────────────────────────────────┘
                    │
                    ▼
┌─────────────────────────────────────────┐
│ Extract a surface contour of the object from the digital representation of │
│              the object.                │
│              -2030-                     │
└─────────────────────────────────────────┘
                    │
                    ▼
┌─────────────────────────────────────────┐
│ Generate a bounding polygon adjacent to the surface contour of the │
│ object, the bounding polygon being offset from the surface contour of the │
│ object based on a configuration defined in the image acquisition │
│        configuration parameters.        │
│              -2040-                     │
└─────────────────────────────────────────┘
                    │
                    ▼
┌─────────────────────────────────────────┐
│ Generate a configurable quantity of waypoints at configurable intervals │
│        along the bounding polygon.      │
│              -2050-                     │
└─────────────────────────────────────────┘
                    │
                    ▼
┌─────────────────────────────────────────┐
│ Generate an Image Acquisition Plan (IAP) from the waypoints, the IAP │
│ including, for each waypoint, a waypoint position, control instructions, │
│         and imaging instructions.       │
│              -2060-                     │
└─────────────────────────────────────────┘
                    │
                    ▼
                 ( End )
```

Fig. 9

SYSTEM AND METHOD FOR DIGITAL-REPRESENTATION-BASED FLIGHT PATH PLANNING FOR OBJECT IMAGING

PRIORITY PATENT APPLICATIONS

This is a continuation-in-part (CIP) patent application claiming priority to U.S. non-provisional patent application Ser. No. 17/128,141, filed on Dec. 20, 2020; which is a continuation application of patent application Ser. No. 16/023,449, filed on Jun. 29, 2018. This is also a CIP patent application claiming priority to U.S. non-provisional patent application Ser. No. 16/131,456, filed on Sep. 14, 2018; which is a CIP of patent application Ser. No. 16/023,449, filed on Jun. 29, 2018. This present patent application draws priority from the referenced patent applications. The entire disclosure of the referenced patent applications is considered part of the disclosure of the present application and is hereby incorporated by reference herein in its entirety.

COPYRIGHT

A portion of the disclosure of this patent document contains material that is subject to copyright protection. The copyright owner has no objection to the facsimile reproduction of the patent document or the patent disclosure, as it appears in the Patent and Trademark Office patent files or records, but otherwise reserves all copyright rights whatsoever. The following notice applies to the disclosure provided herein and to the drawings that form a part of this document: Copyright 2018-2021 PhotoGAUGE, Inc., All Rights Reserved.

TECHNICAL FIELD

This patent application relates to computer-implemented software systems, metrology systems, photogrammetry-based systems, and automatic visual measurement or inspection systems, and systems for quality control of manufactured or naturally occurring materials, components, or assemblies according to example embodiments, and more specifically to a system and method for digital-representation-based flight path planning for object imaging.

BACKGROUND

Visual inspection is an essential step in the quality assurance (QA) process of fabricated components or objects. For example, visual inspection is performed for: 1) recognizing cracks, scratches, discolorations and other blemishes on manufactured parts, gemstone, floor tile, leather sheet surfaces, etc., 2) assessing the integrity of a component assembly by identifying misassembled or missing subcomponents; 3) measuring the size, position, surface roughness, etc. of objects or features on an object; and 4) counting the number of objects or features, such as holes and slots, on a component or object.

Visual inspection or imaging of manufactured parts is commonly performed manually. In many cases, visual inspection or imaging is performed by manual inspectors with cameras. However, repetitive manual inspection by human inspectors is subjective, error-prone (affected by inspector fatigue), and expensive. In some cases, visual inspection of manufactured parts can be performed using drone aircraft with on-board cameras. However, these drones are flown manually by drone operators; the visual inspection of manufactured parts and any data or images collected for photogrammetry of manufactured parts using conventional techniques produces unsatisfactory results. Therefore, there are on-going efforts to automate visual inspection.

SUMMARY

In various example embodiments described herein, a system and method for digital-representation-based flight path planning for object imaging are disclosed. In the various example embodiments described herein, an image acquisition plan generation system is provided to address the shortcomings of the conventional technologies as described above. The image acquisition plan generation system of various example embodiments disclosed herein can be configured to: 1) use a digital representation of a component, building, structure, vessel, aircraft, artwork, or environment (generally denoted herein as an object) to extract a two-dimensional (2D) surface contour of the object, 2) use image acquisition configuration parameters to generate a bounding polygon around the object based on the extracted object contour at a configurable distance from the surface of the object, 3) generate a set of waypoints around the object at configurable intervals based on the bounding polygon, 4) generate an image acquisition plan (IAP) based on the set of waypoints, the IAP including for each waypoint, a three-dimensional (3D) position relative to the surface of the object, one or more camera poses at each waypoint, one or more actions to perform at each waypoint, and timing information at the waypoint, and 5) provide the IAP to a navigation controller of an autonomous drone, rover, any type of robotic device, smart wearables such as smart glasses, or the like to enable the autonomous drone or rover to independently traverse the 3D path defined by the IAP and image the object and/or perform actions on the surface of the object at various points along the 3D path. Details of the various example embodiments are provided below.

BRIEF DESCRIPTION OF THE DRAWINGS

The various embodiments are illustrated by way of example, and not by way of limitation, in the figures of the accompanying drawings in which:

FIG. 7 illustrates another sample object and a conventional drone traversing the path with various drone or camera poses defined by the image acquisition plan (IAP) generated by an example embodiment of a system and method as disclosed herein;

FIG. 9 is a processing flow diagram that illustrates example embodiments of methods as described herein.

DETAILED DESCRIPTION

In the following description, for purposes of explanation, numerous specific details are set forth in order to provide a thorough understanding of the various embodiments. It will be evident, however, to one of ordinary skill in the art that the various embodiments may be practiced without these specific details.

In various example embodiments described herein, a system and method for digital-representation-based flight path planning for object imaging are disclosed. In the various example embodiments described herein, an image acquisition plan generation system can be implemented on or with a computing platform, such as the computing platform described below in connection with FIG. 10. The image acquisition plan generation system can be used in combination with or separately from a drone or rover used for capturing images or performing actions.

In the various example embodiments disclosed herein, the image acquisition plan generation system can be configured to: 1) use a digital representation of a component, building, structure, vessel, aircraft, artwork, or environment (generally denoted herein as an object) to extract a two-dimensional (2D) surface contour of the object, 2) use image acquisition configuration parameters to generate a bounding polygon around the object based on the extracted object contour at a configurable distance from the surface of the object, 3) generate a set of waypoints around the object at configurable intervals based on the bounding polygon, 4) generate an image acquisition plan (IAP) based on the set of waypoints, the IAP including for each waypoint, a three-dimensional (3D) position relative to the surface of the object (or absolute position), one or more camera poses at each waypoint, one or more actions to perform at each waypoint, and timing information at the waypoint, and 5) provide the TAP to a navigation controller of an autonomous drone or rover to enable the autonomous drone or rover to independently traverse the 3D path defined by the IAP and image the object and/or perform actions on the surface of the object at various points along the 3D path.

Figure 1:
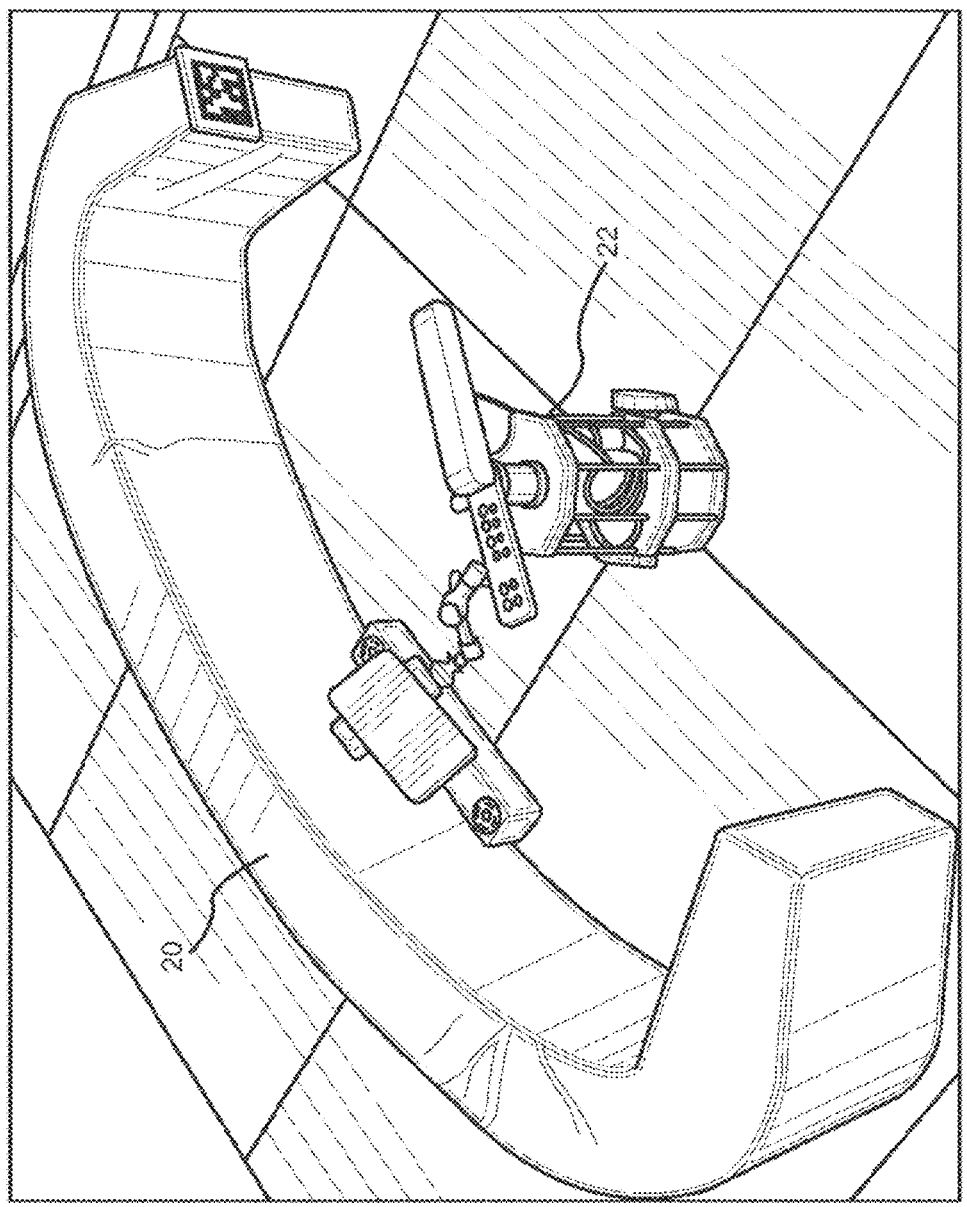
FIG. 1 illustrates a sample object and a conventional drone that can be used to take images of the object, gather sensor data from the object, or perform actions on the object according to an example embodiment of a system and method as disclosed herein.

Referring now to FIG. 1, the diagram illustrates a sample object 20 and a conventional drone 22 with a camera that can be used to take images of the object, gather sensor data from the object, or perform actions on the object according to an example embodiment of a system and method as disclosed herein. In various embodiments, the system and method disclosed herein enables an autonomous mobile device 22 (e.g., an aerial drone, a rover, or the like) to be fitted with an image capture device (e.g., a single image or video camera, an infrared or thermal imaging system, X-ray imaging system, acoustic imaging system, or any other kind of imaging device), one or more sensors (e.g., laser, radar, LIDAR, thermometer, magnetometer, Geiger counter, moisture detector, pressure sensor, acoustic sensor, or any other kind of sensor device), and/or a fabrication payload or tool (e.g., a paint spraying system, a welding system, a component pick and place system, a cleaning system, a de-icing system, a cutting system, or the like). In various embodiments, the system and method disclosed herein enable the autonomous mobile device 22 to take images of the object 20, gather sensor data from the object 20, and/or perform actions on the object 20, wherein the object 20 can be any of a wide variety of objects including, manufactured components, parts, or systems, buildings, structures, vessels, aircraft, vehicles, trains, artwork, tunnels, pipelines, roadways, industrial facilities, refineries, manufacturing plants, fulfillment centers, environments, or any other type of object having surfaces that can be imaged, inspected, measured, or fabricated (generally denoted herein as an object). In the example shown in FIG. 1, a manufactured component 20 is shown with an arbitrary shape having contour and surfaces, which can be imaged, inspected, measured, or fabricated using example embodiments of the system and method as disclosed herein. As shown in the example of FIG. 1, a rover 22 is fitted with a camera. Using the techniques described in more detail below, an example embodiment can produce a navigable path defined in an image acquisition plan (IAP), which the rover 22 can autonomously traverse to capture an optimal or quality set of images of the surfaces of the object 20 pursuant to a pre-defined and configurable strategy for the image capture. Additionally, the IAP can define one or more camera poses and/or one or more actions to be performed at various points along the navigable path. As a result, the set of images of the object 20 can be used by other systems for a variety of purposes including, image archiving, inspection, defect detection, assembly and/or quantity compliance, metrology, photogrammetry, fabrication, and the like.

Figure 2:
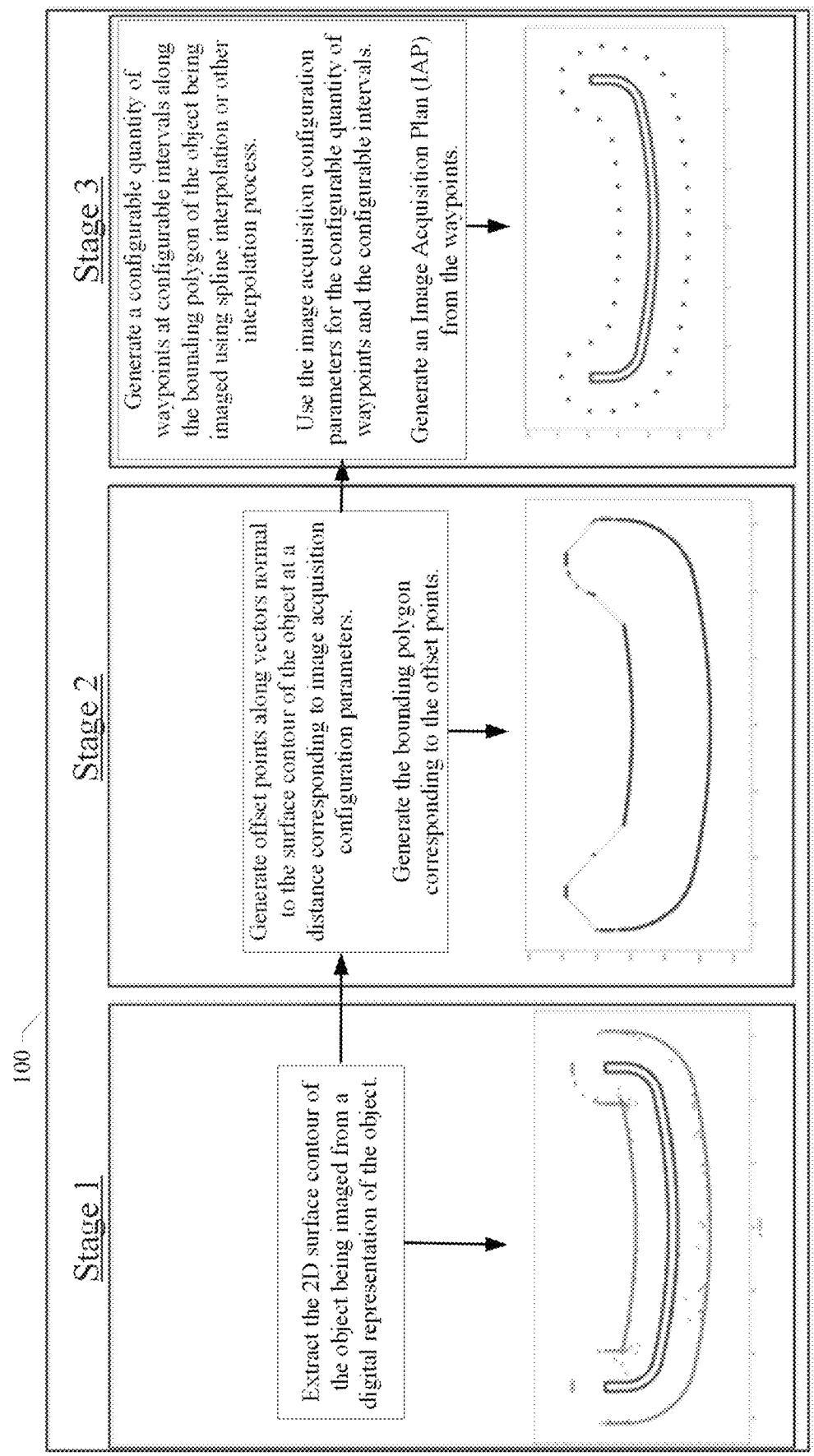
FIG. 2 illustrates three processing stages for generating an image acquisition plan (IAP) in an example embodiment of a system and method as disclosed herein.

Referring now to FIG. 2, the diagram illustrates three processing stages, performed by an image acquisition plan generation system 100, for generating an image acquisition plan (IAP) in an example embodiment of a system and method as disclosed herein. In a first processing stage (Stage 1), the image acquisition plan generation system 100 can be configured to extract the 2D surface contour of the object being imaged from a digital representation of the object. The digital representation of the object can be obtained in a variety of conventional ways. For example, a 2D or 3D computer-aided design (CAD) model of the object can be used as a digital representation of the object. In other embodiments, a digitized set of architectural drawings or blueprints, simulation models, artificial intelligence (AI) models, mathematical models, drawings, schematics, Global Positioning System (GPS) information, or any other data digitized in a computer readable form, from which a 3D representation of the object can be extracted, can be used as a digital representation of the object. Given the digital representation of the object, the image acquisition plan generation system 100 can be configured to extract the 2D surface contour of the object as shown in FIG. 2.

In a second processing stage (Stage 2), the image acquisition plan generation system 100 can be configured to generate offset points along vectors normal to the surface contour of the object at a distance corresponding to image acquisition configuration parameters. The length of the vectors, a configurable parameter, defines a separation distance between the surface of the object and the location where the autonomous mobile device 22 should be positioned at a particular offset point. The set of vectors define offset points around or through the object. The set of offset points define a bounding polygon around the object as shown in the example of FIG. 2. The offset points can be used by the image acquisition plan generation system 100 in the second processing stage (Stage 2) to generate the bounding polygon corresponding to the offset points and the surface contour of the object.

In a third processing stage (Stage 3), the image acquisition plan generation system 100 can be configured to generate a configurable quantity of waypoints at configurable intervals along the bounding polygon generated for the object. The image acquisition configuration parameters can be initialized to pre-define the configurable quantity of waypoints and the configurable intervals between the waypoints. In an example embodiment, spline interpolation can be used to generate the waypoints along the bounding polygon. Other techniques, such as using lookup tables and polynomial interpolation can also be used. Typically, the waypoints will be evenly spaced around the bounding polygon as shown in the example of FIG. 2, but even spacing is not required. Depending on the object being imaged, it may be necessary to cluster waypoints at particular locations of the object. Having generated the set of waypoints along the bounding polygon corresponding to the object, the image acquisition plan generation system 100 can be configured to generate an Image Acquisition Plan (IAP) from the waypoints. Each waypoint defines a 3D location or position proximate to the surface of the object at which the autonomous mobile device 22 will be positioned for image capture and/or performance of an action on the object. Thus, the image acquisition plan generation system 100 can generate, for each waypoint, the 3D waypoint position, control instructions to navigate the autonomous mobile device 22 to the waypoint, imaging instructions to control a camera of the autonomous mobile device 22 at the waypoint (e.g., pose, tilt/pan/zoom, focus, filter, shutter speed, aperture, etc.), action instructions to control a payload, tool, or sensor of the autonomous mobile device 22 to perform an action on the object at the waypoint (e.g., use a paint spraying system, a welding system, a component pick and place system, a cleaning system, a de-icing system, a cutting system, or the like on the object), communication instructions to initiate communications, notifications, alerts or the like at the waypoint with a control center or another autonomous mobile device, and timing instructions to synchronize the presence of the autonomous mobile device 22 at the waypoint at a particular time or set a dwell time for which the autonomous mobile device 22 will remain at the waypoint. Some or all of the instructions and information described above can be retained for each waypoint in the Image Acquisition Plan (IAP). It will be apparent to those of ordinary skill in the art in view of the present disclosure that the IAP can include additional information, instructions, and/or parameters for each waypoint or groupings of waypoints. As described in more detail below, the IAP can be provided to a controller or navigation system of an autonomous mobile device 22, such as a drone or rover.

Figure 3:
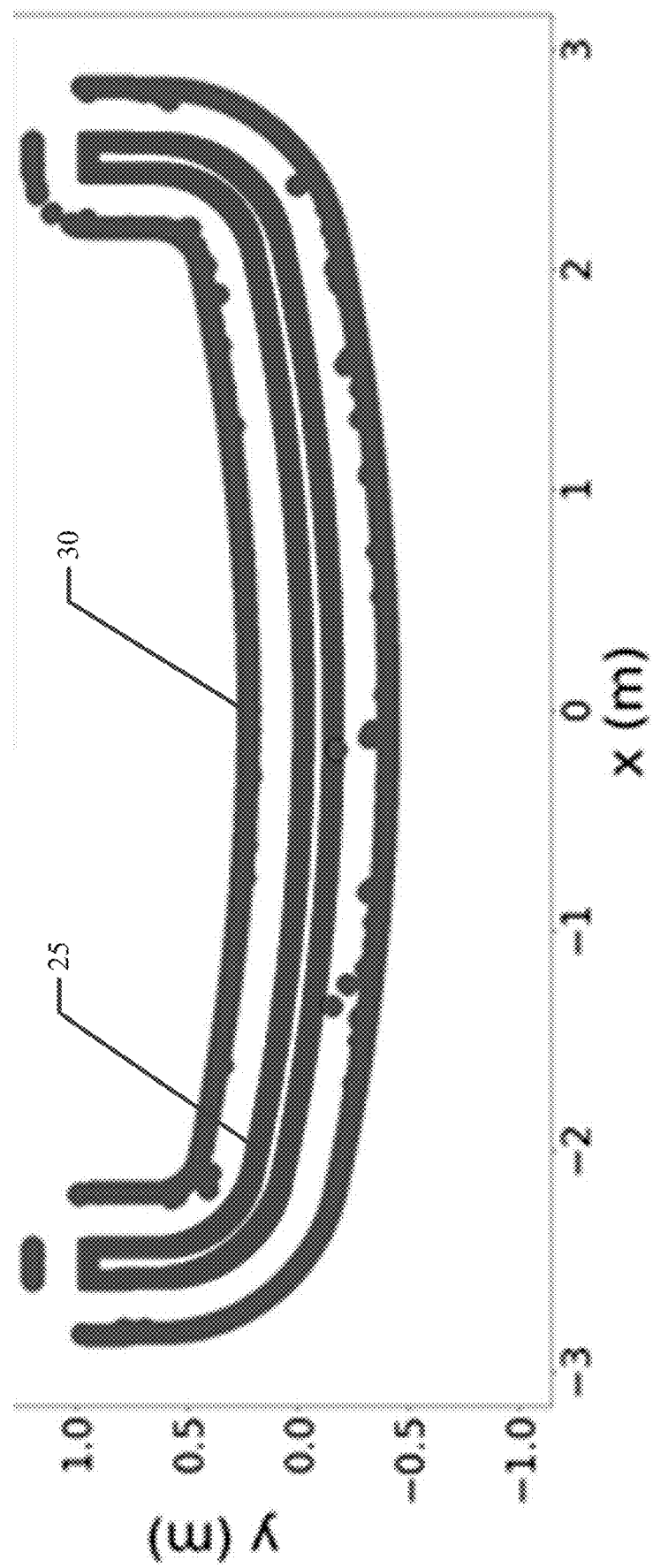
FIG. 3 illustrates details of a first processing stage for object contour extraction in an example embodiment of a system and method as disclosed herein.

Referring now to FIG. 3, the diagram illustrates details of the first processing stage for object contour extraction in an example embodiment of a system and method as disclosed herein. The image acquisition plan generation system 100 of an example embodiment can be configured to extract the 2D surface contour 30 of the object being imaged 25 from a digital representation of the object. As described above, the digital representation of the object can be obtained in a variety of conventional ways, such as CAD models, digitized architectural drawings, or any other data digitized in a computer readable form from which a 3D representation of the object can be extracted. As shown in FIG. 3, the surface contour 30 of the object being imaged 25 can be extracted from a digital representation of the object. For complex or intricate object structures, the surface contour of the object can be simplified or smoothed to filter out unnecessary surface details.

Figure 4A:
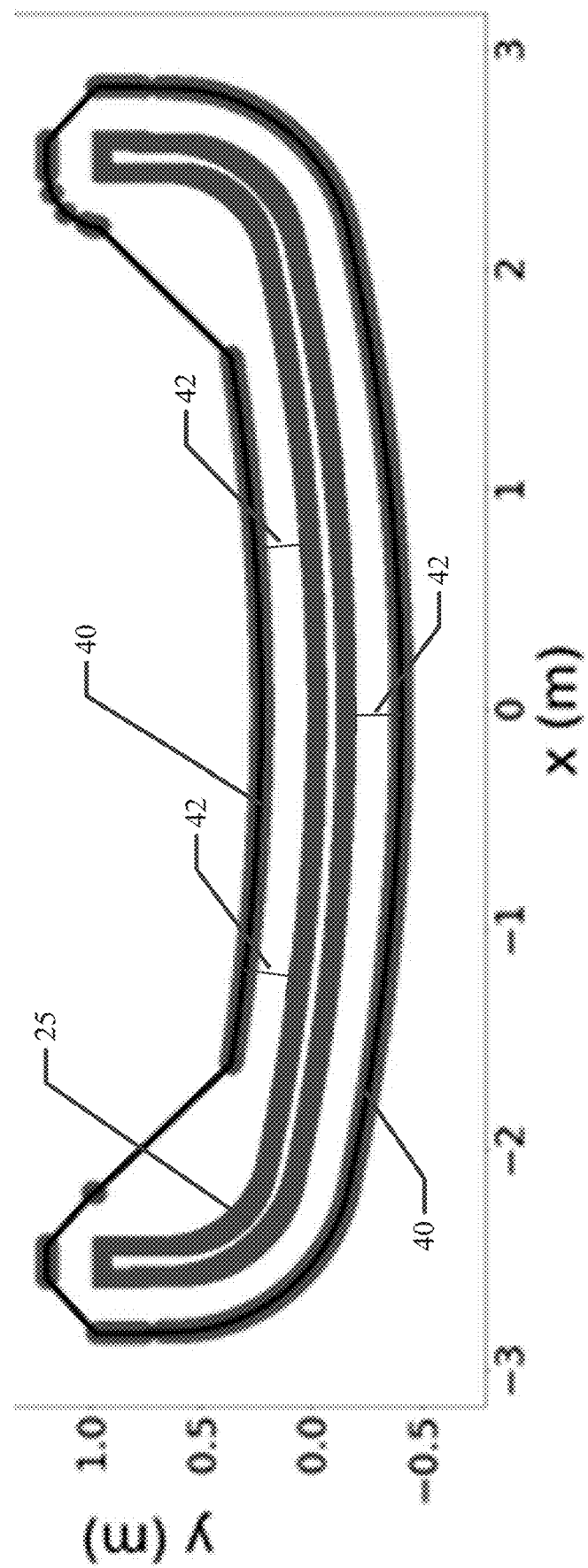
FIGS. 4A and 4B illustrate details of a second processing stage for bounding polygon generation in an example embodiment of a system and method as disclosed herein.
Figure 4B:
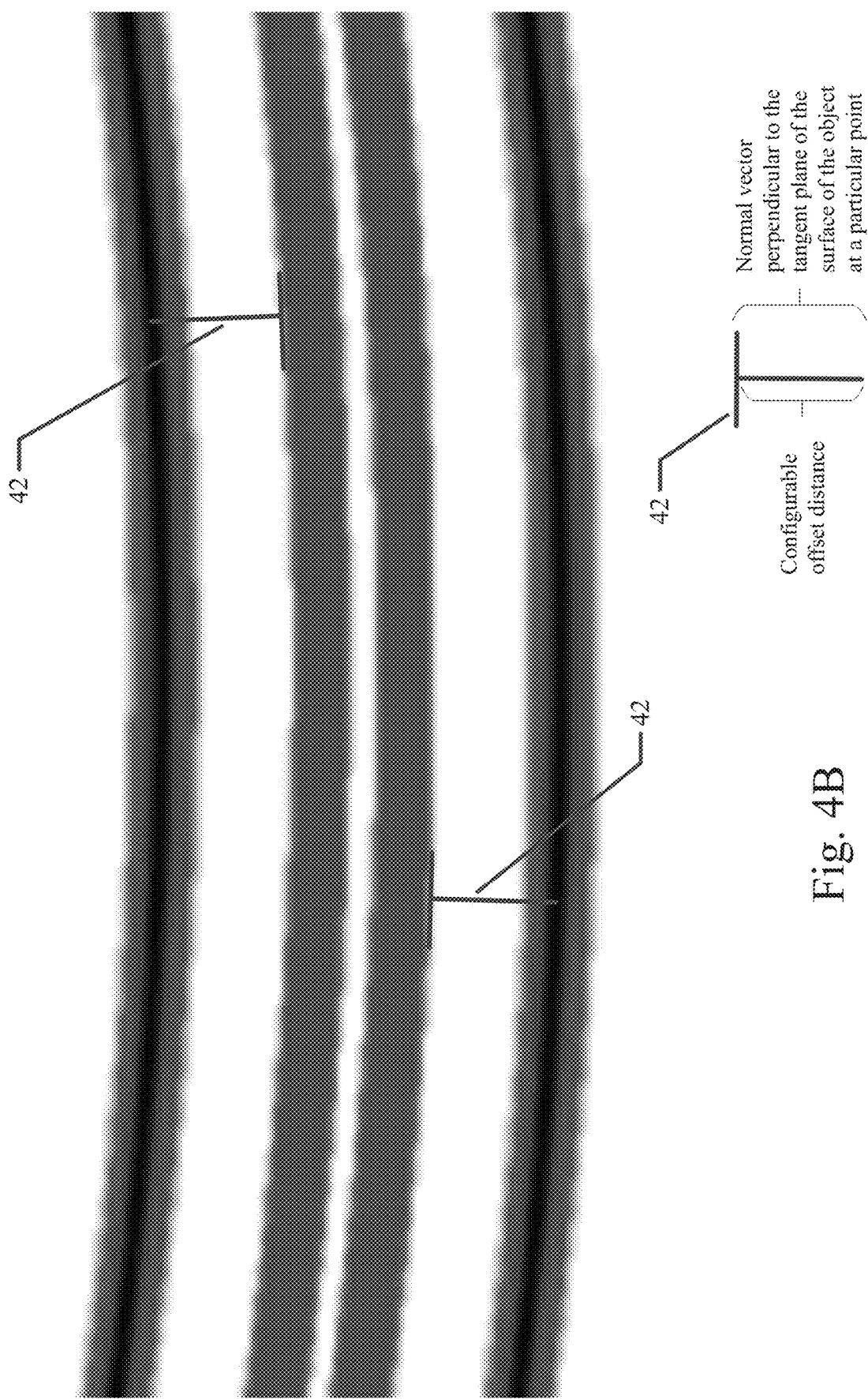

Referring now to FIGS. 4A and 4B, the diagrams illustrate details of the second processing stage for bounding polygon generation in an example embodiment of a system and method as disclosed herein. In the second processing stage (Stage 2), the image acquisition plan generation system 100 can be configured to generate offset points along vectors 42 normal to the surface contour of the object 25 at a distance corresponding to image acquisition configuration parameters. As shown in detail in FIG. 4B, the length of the vectors 42, a configurable parameter, defines a set-off distance or separation distance between the surface of the object 25 and the location where the autonomous mobile device 22 should be positioned at a particular offset point. The configurable set-off distance enables the user to adjust for the accuracy of detail needed for a particular waypoint. Each vector 42 is a normal vector perpendicular to the tangent plane of the surface of the object at a particular point. The set of vectors 42 define offset points around or through the object 25. The set of offset points define a bounding polygon 40 around the object 25 as shown in the example of FIGS. 4A and 4B. The offset points can be used by the image acquisition plan generation system 100 in the second processing stage (Stage 2) to generate the bounding polygon 40 corresponding to the offset points and the surface contour of the object 25.

Figure 5:
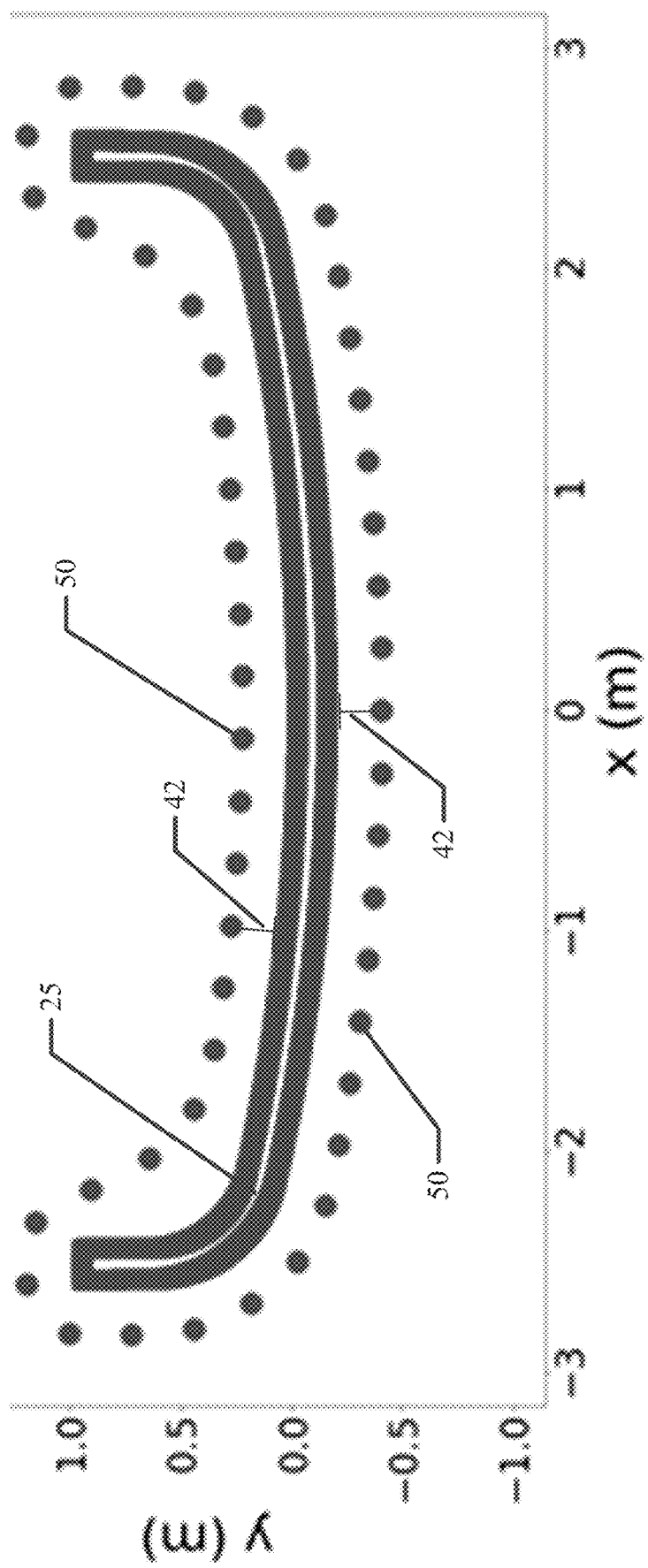
FIG. 5 illustrates details of a third processing stage for image acquisition plan (IAP) generation in an example embodiment of a system and method as disclosed herein.

Referring now to FIG. 5, the diagram illustrates details of the third processing stage for image acquisition plan (IAP) generation in an example embodiment of a system and method as disclosed herein. In the third processing stage (Stage 3), the image acquisition plan generation system 100 can be configured to generate a configurable quantity of waypoints 50 at configurable intervals along the bounding polygon generated for the object 25. The image acquisition configuration parameters can be initialized to pre-define the configurable quantity of waypoints 50 and the configurable intervals between the waypoints 50. In an example embodiment, spline interpolation can be used to generate the waypoints 50 along the bounding polygon. Other techniques, such as using lookup tables and polynomial interpolation can also be used. Typically, the waypoints 50 will be evenly spaced around the bounding polygon as shown in the example of FIG. 5, but even spacing is not required. Depending on the object 25 being imaged, it may be necessary to cluster waypoints at particular locations of the object 25. Having generated the set of waypoints 50 along the bounding polygon corresponding to the object 25, the image acquisition plan generation system 100 can be configured to generate an Image Acquisition Plan (IAP) from the waypoints 50. Each waypoint 50 defines a 3D location or position proximate to the surface of the object 25 at which the autonomous mobile device 22 will be positioned for image capture and/or performance of an action on the object 25. Thus, the image acquisition plan generation system 100 can generate, for each waypoint, the 3D waypoint position, control instructions, imaging instructions, action instructions, communication instructions, and timing instructions as described above. Some or all of the instructions and information described above can be retained for each waypoint in the Image Acquisition Plan (IAP). As described in more detail below, the IAP can be provided to a controller or navigation system of an autonomous mobile device 22, such as a drone or rover.

Figure 6:
FIG. 6 illustrates a visualization of a sample object and a conventional drone traversing the path defined by the image acquisition plan (IAP) generated by an example embodiment of a system and method as disclosed herein.

Referring now to FIG. 6, the diagram illustrates a visualization of the sample object 25 and a conventional drone 24 traversing the path 60 defined by the image acquisition plan (IAP) generated by an example embodiment of a system and method as disclosed herein. As shown in FIG. 6, the drone 24 flies a 3D path that conforms to the set of waypoints generated by the image acquisition plan generation system 100 as described above. The path maintains a configurable and well-controlled distance from the surface contours of the object 25. As a result, the drone 24 can capture images of the object 25 or perform actions on the object 25 from a pre-defined and consistent distance from the object 25. Moreover, the IAP can specify the 3D waypoint position, control instructions, imaging instructions, action instructions, communication instructions, and timing instructions for each waypoint as described above. Because the IAP defines the position and instruction information for each waypoint, the set-off distance from the object can be the same distance or different distances for each waypoint. Moreover, different sets of images or poses or different actions can be performed at each waypoint as defined in the IAP.

Referring now to FIG. 7, the diagram illustrates another sample object 27 and a conventional drone 24 traversing the 3D path that conforms to the set of waypoints generated by the image acquisition plan generation system 100 as described above. As shown in FIG. 7, the drone 24 can traverse the 3D path defined by the set of waypoints. As described above, the IAP can define imaging instructions, among other instruction sets, for each waypoint on the 3D path. The imaging instructions can specify various drone 24 poses, drone camera poses, camera settings, and the like, as defined by the image acquisition plan (IAP) generated by the image acquisition plan generation system 100 as described above. As such, the drone 24 can capture a set of images of the object 27 from a highly-controlled, configurable, and repeatable set of 3D positions adjacent to the surfaces of the object 27.

The image acquisition plan generation system 100 can generate the IAP defining multiple navigable paths for the autonomous mobile device 24 so the autonomous mobile device 24 covers the entire surface of the object. For example, the image acquisition plan generation system 100 can generate the IAP defining multiple navigable paths that image stacked cross-sections of the object. Alternatively, the image acquisition plan generation system 100 can generate the IAP defining a single continuous spiral path or multiple loop paths to cover the entire surface of the object. In other embodiments, the image acquisition plan generation system 100 can generate the IAP defining one or more arbitrary paths to cover the entire surface of the object. In some cases, it may be necessary to define and establish a fixed marker near the object so the autonomous mobile device 24 can orient to the marker prior to beginning its traversal of the path defined in the IAP.

Figure 8:
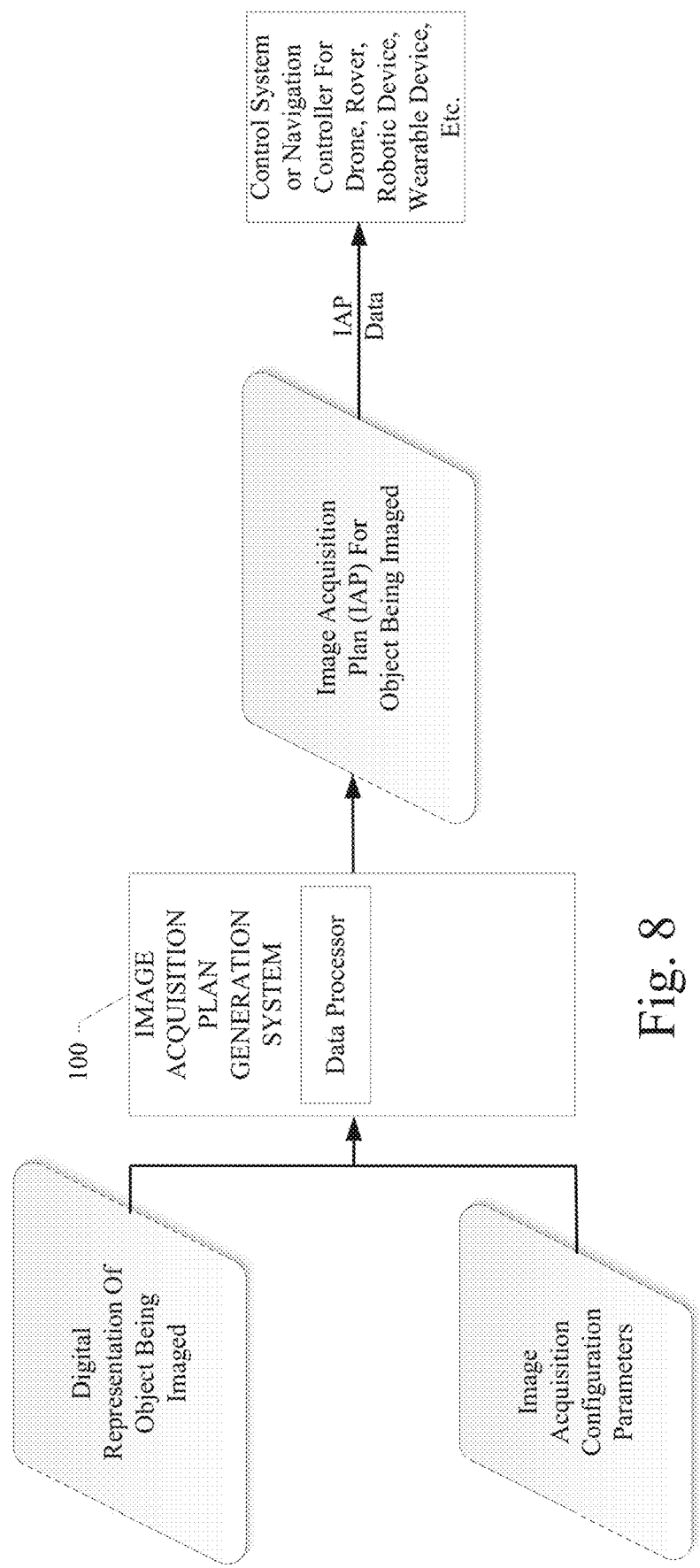
FIG. 8 is a structure diagram that illustrates example embodiments of systems and data processing as described herein.

Referring now to FIG. 8, a structure diagram illustrates example embodiments of systems as described herein. As detailed above, the image acquisition plan generation system 100 of various example embodiments can generate an image acquisition plan (IAP) to guide an autonomous mobile device around or through a particular object. In the processing stages described above, the image acquisition plan generation system 100 can use a data processor to retrieve or access a digital representation of the object. As described above, the digital representation of the object can be obtained in a variety of conventional ways, such as CAD models, digitized architectural drawings, or any other data digitized in a computer readable form from which a 3D representation of the object can be extracted. The image acquisition plan generation system 100 can also use the data processor to retrieve or access a dataset of image acquisition configuration parameters. The image acquisition configuration parameters can be used to pre-define the desired set-off distance between the surface of the object and each waypoint at which the autonomous mobile device will be positioned. The image acquisition configuration parameters can be stored in a conventional data storage device, such as a digital memory device or cloud storage. The image acquisition plan generation system 100 can use the digital representation of the object and the image acquisition configuration parameters to generate a bounding polygon around the object based on extracted object surface contours at a configurable distance from the surface of the object. The image acquisition plan generation system 100 can also generate a configurable quantity of waypoints around the object at configurable intervals based on the bounding polygon and the image acquisition configuration parameters. Finally, as shown in FIG. 8, the image acquisition plan generation system 100 can generate, as described above, an image acquisition plan (IAP) based on the set of waypoints, the IAP including for each waypoint, the 3D waypoint position, control instructions, imaging instructions, action instructions, communication instructions, and timing instructions as detailed above. As shown in FIG. 8, the image acquisition plan generation system 100 can provide the IAP to a controller or navigation system of an autonomous mobile device, such as a drone or rover. The autonomous mobile device, or a device for controlling the autonomous mobile device, can use the information in the IAP to guide the autonomous mobile device to each of the waypoints generated by the image acquisition plan generation system 100, to cause the autonomous mobile device to assume defined poses or take actions at each waypoint, and to maintain precise timing all dictated by the IAP generated by the image acquisition plan generation system 100 as described herein.

Referring now to FIG. 9, a processing flow diagram illustrates an example embodiment of a method implemented by the example embodiments as described herein. The method 2000 of an example embodiment can be configured to: obtain a digital representation of an object (processing block 2010); retrieve a dataset of image acquisition configuration parameters (processing block 2020); extract a surface contour of the object from the digital representation of the object (processing block 2030); generate a bounding polygon adjacent to the surface contour of the object, the bounding polygon being set-off from the surface contour of the object based on a configuration defined in the image acquisition configuration parameters (processing block 2040); generate a configurable quantity of waypoints at configurable intervals along the bounding polygon (processing block 2050); and generate an Image Acquisition Plan (IAP) from the waypoints, the IAP including, for each waypoint, a waypoint position, control instructions, and imaging instructions (processing block 2060).

Figure 10:
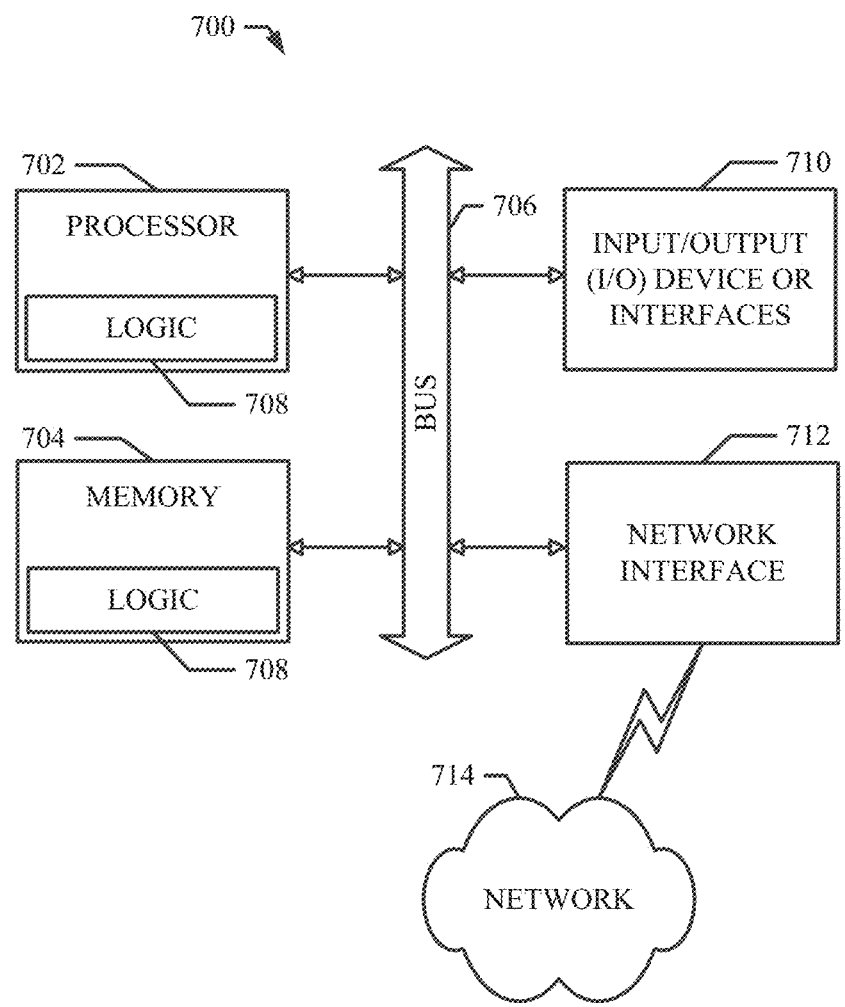
FIG. 10 shows a diagrammatic representation of a machine in the example form of a computer system within which a set of instructions when executed may cause the machine to perform any one or more of the methodologies discussed herein.

FIG. 10 shows a diagrammatic representation of a machine in the example form of a mobile computing and/or communication system 700 within which a set of instructions when executed and/or processing logic when activated may cause the machine to perform any one or more of the methodologies described and/or claimed herein. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a personal computer (PC), a laptop computer, a tablet computing system, a Personal Digital Assistant (PDA), a cellular telephone, a smartphone, a web appliance, a set-top box (STB), a network router, switch or bridge, or any machine capable of executing a set of instructions (sequential or otherwise) or activating processing logic that specify actions to be taken by that machine. Further, while only a single machine is illustrated, the term "machine" can also be taken to include any collection of machines that individually or jointly execute a set (or multiple sets) of instructions or processing logic to perform any one or more of the methodologies described and/or claimed herein.

The example mobile computing and/or communication system 700 includes a data processor 702 (e.g., a System-on-a-Chip (SoC), general processing core, graphics core, and optionally other processing logic) and a memory 704, which can communicate with each other via a bus or other data transfer system 706. The mobile computing and/or communication system 700 may further include various input/output (I/O) devices and/or interfaces 710, such as a touchscreen display, an audio jack, and optionally a network interface 712. In an example embodiment, the network interface 712 can include one or more radio transceivers configured for compatibility with any one or more standard wireless and/or cellular protocols or access technologies (e.g., 2nd (2G), 2.5, 3rd (3G), 4th (4G) generation, and future generation radio access for cellular systems, Global System for Mobile communication (GSM), General Packet Radio Services (GPRS), Enhanced Data GSM Environment (EDGE), Wideband Code Division Multiple Access (WCDMA), LTE, CDMA2000, WLAN, Wireless Router (WR) mesh, and the like). Network interface 712 may also be configured for use with various other wired and/or wireless communication protocols, including TCP/IP, UDP, SIP, SMS, RTP, WAP, CDMA, TDMA, UMTS, UWB, WiFi, WiMax, Bluetooth™, IEEE 802.11x, and the like. In essence, network interface 712 may include or support virtually any wired and/or wireless communication mechanisms by which information may travel between the mobile computing and/or communication system 700 and another computing or communication system via network 714.

The memory 704 can represent a machine-readable medium on which is stored one or more sets of instructions, software, firmware, or other processing logic (e.g., logic 708) embodying any one or more of the methodologies or functions described and/or claimed herein. The logic 708, or a portion thereof, may also reside, completely or at least partially within the processor 702 during execution thereof by the mobile computing and/or communication system 700. As such, the memory 704 and the processor 702 may also constitute machine-readable media. The logic 708, or a portion thereof, may also be configured as processing logic or logic, at least a portion of which is partially implemented in hardware. The logic 708, or a portion thereof, may further be transmitted or received over a network 714 via the network interface 712. While the machine-readable medium of an example embodiment can be a single medium, the term "machine-readable medium" should be taken to include a single non-transitory medium or multiple non-transitory media (e.g., a centralized or distributed database, and/or associated caches and computing systems) that stores the one or more sets of instructions. The term "machine-readable medium" can also be taken to include any non-transitory medium that is capable of storing, encoding or carrying a set of instructions for execution by the machine and that cause the machine to perform any one or more of the methodologies of the various embodiments, or that is capable of storing, encoding or carrying data structures utilized by or associated with such a set of instructions. The term "machine-readable medium" can accordingly be taken to include, but not be limited to, solid-state memories, optical media, and magnetic media.

As described herein for various example embodiments, a system and method for digital-representation-based flight path planning for object imaging are disclosed. In various embodiments, a software application program is used to enable the capture and processing of images on a computing or communication system, including mobile devices. As described above, in a variety of contexts, the various example embodiments can be configured to automatically produce and use synthetic images for training a machine learning model. This collection of synthetic training images can be distributed to a variety of networked computing systems. As such, the various embodiments as described herein are necessarily rooted in computer and network technology and serve to improve these technologies when applied in the manner as presently claimed. In particular, the various embodiments described herein improve the use of mobile device technology and data network technology in the context of automated object visual inspection via electronic means.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system comprising:
 a data processor;
 an image acquisition plan generation system in data communication with the data processor, the image acquisition plan generation system configured to:
  obtain a digital representation of an object;
  retrieve a dataset of image acquisition configuration parameters;
  extract a surface contour of the object from the digital representation of the object;
  generate a bounding polygon adjacent to the surface contour of the object, the bounding polygon being set-off from the surface contour of the object based on a configuration defined in the image acquisition configuration parameters;
  generate a configurable quantity of waypoints at configurable intervals along the bounding polygon; and
  generate an Image Acquisition Plan (IAP) from the waypoints, the IAP including, for each waypoint, a waypoint position, control instructions, and imaging instructions.

2. The system of claim 1 wherein the IAP further includes a definition of a navigable path for an autonomous mobile device, action instructions, communication instructions, and timing instructions for the autonomous mobile device.

3. The system of claim 1 wherein the digital representation of the object includes a digital representation from the group consisting of: a computer-aided design (CAD) model of the object, a digitized set of architectural drawings or blueprints, simulation models, artificial intelligence (AI) models, mathematical models, drawings, schematics, Global Positioning System (GPS) information, and data digitized in a computer readable form from which a digital representation of the object can be extracted.

4. The system of claim 1 wherein the image acquisition plan generation system being further configured to generate offset points along vectors normal to the surface contour of the object at a distance corresponding to the image acquisition configuration parameters.

5. The system of claim 1 wherein the image acquisition plan generation system being further configured to generate the configurable quantity of waypoints using a process from the group consisting of: spline interpolation, table lookup, and polynomial interpolation.

6. The system of claim 1 wherein the image acquisition plan generation system being further configured to provide the IAP to a controller or navigation system of an autonomous mobile device.

7. The system of claim 1 wherein the imaging instructions of the IAP including, for each waypoint, one or more camera poses.

8. The system of claim 1 wherein the control instructions of the IAP including, for each waypoint, instructions to navigate an autonomous mobile device.

9. The system of claim 1 wherein the IAP further includes a definition of, for each waypoint, action instructions, wherein the action instructions define an action the autonomous mobile device should perform at a waypoint.

10. The system of claim 1 wherein the IAP further includes a definition of, for each waypoint, communication instructions, wherein the communication instructions define a communication the autonomous mobile device should transmit or receive at a waypoint.

11. The system of claim 1 wherein the IAP further includes a definition of, for each waypoint, timing instructions, wherein the timing instructions control timing for the autonomous mobile device.

12. A method comprising:
obtaining a digital representation of an object;
retrieving a dataset of image acquisition configuration parameters;
extracting a surface contour of the object from the digital representation of the object;
generating a bounding polygon adjacent to the surface contour of the object, the bounding polygon being set-off from the surface contour of the object based on a configuration defined in the image acquisition configuration parameters;
generating a configurable quantity of waypoints at configurable intervals along the bounding polygon; and
generating an Image Acquisition Plan (IAP) from the waypoints, the IAP including, for each waypoint, a waypoint position, control instructions, and imaging instructions.

13. The method of claim 12 wherein the IAP further includes a definition of a navigable path for an autonomous mobile device, action instructions, communication instructions, and timing instructions for the autonomous mobile device.

14. The method of claim 12 wherein the digital representation of the object includes a digital representation from the group consisting of: a computer-aided design (CAD) model of the object, a digitized set of architectural drawings or blueprints, simulation models, artificial intelligence (AI) models, mathematical models, drawings, schematics, Global Positioning System (GPS) information, and data digitized in a computer readable form from which a digital representation of the object can be extracted.

15. The method of claim 12 including generating offset points along vectors normal to the surface contour of the object at a distance corresponding to the image acquisition configuration parameters.

16. The method of claim 12 including providing the IAP to a controller or navigation system of an autonomous mobile device.

17. The method of claim 12 wherein the imaging instructions of the IAP including, for each waypoint, one or more camera poses.

18. The method of claim 12 wherein the control instructions of the IAP including, for each waypoint, instructions to navigate an autonomous mobile device.

19. The method of claim 12 wherein the IAP further includes a definition of, for each waypoint, action instructions, wherein the action instructions define an action the autonomous mobile device should perform at a waypoint.

20. The method of claim 12 wherein the IAP further includes a definition of, for each waypoint, communication instructions, wherein the communication instructions define a communication the autonomous mobile device should transmit or receive at a waypoint.

* * * * *